(12) United States Patent
Feng

(10) Patent No.: US 7,538,622 B2
(45) Date of Patent: May 26, 2009

(54) MULTIPLE REFERENCE FREQUENCY FRACTIONAL-N PLL (PHASE LOCKED LOOP)

(75) Inventor: Kai Di Feng, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 79 days.

(21) Appl. No.: 11/696,268

(22) Filed: Apr. 4, 2007

(65) Prior Publication Data

US 2008/0246521 A1    Oct. 9, 2008

(51) Int. Cl.
  *H03L 7/00* (2006.01)
  *H03L 7/06* (2006.01)
  *H03B 5/12* (2006.01)

(52) U.S. Cl. .............. 331/16; 331/18; 331/49; 331/34; 327/156; 327/157

(58) Field of Classification Search .......... 331/16, 331/18, 49, 34; 327/156, 157
  See application file for complete search history.

(56) References Cited

U.S. PATENT DOCUMENTS

| 5,276,716 | A  | * | 1/1994 | Wincn ............ 375/376 |
| 7,012,471 | B2 | * | 3/2006 | Lyden et al. ...... 331/16 |
| 2008/0208541 | A1 | | 8/2008 | Cesky et al. |

OTHER PUBLICATIONS

Office Action (Mail Date Dec. 30, 2008) for U.S. Appl. No. 11/873,010, filed Oct. 16, 2007; Confirmation No. 9884.

* cited by examiner

*Primary Examiner*—Rexford Barnie
*Assistant Examiner*—Thienvu V Tran
(74) *Attorney, Agent, or Firm*—Schmeiser, Olsen & Watts; W. Riyon Harding

(57) ABSTRACT

A system and a method for operating the same. The system includes a fractional-N phase-locked loop (PLL). The PLL includes a PLL input and a PLL output. The fractional-N PLL further includes a multiplexer. The multiplexer includes a multiplexer output electrically coupled to the PLL input. The multiplexer further includes M multiplexer inputs, M being an integer greater than 1. Two or more reference frequencies are applied to the inputs of the multiplexer, by the selection of one from the reference frequencies, the low spur can be reached.

3 Claims, 3 Drawing Sheets

MULTIPLE REFERENCE FREQUENCY FRACTIONAL-N PLL (PHASE LOCKED LOOP)

FIELD OF THE INVENTION

The present invention relates generally to fractional-N PLLs (phase-locked loops) and more particularly to fractional-N PLLs that have multiple reference frequencies.

BACKGROUND OF THE INVENTION

A conventional fractional-N PLL (phase-locked loop) has an input of reference frequency Fref and an output signal Fvco from the VCO (Voltage Control Oscillator). There are frequency regions (ranges) of the output signal Fvco in which spurs are very high when the VCO output frequency Fvco is close to the integer times of the input reference signal frequency Fref (so called the pitch frequency). Conventionally, a fractional-N PLL is usually not allowed to operate in these high spur frequency regions. Therefore, there is a need for a structure (and a method for operating the same) in which the fractional-N PLL can operate in any operating frequency region covering several pitch frequencies while keeping spurs low.

SUMMARY OF THE INVENTION

The present invention provides a system, comprising (a) a phase-locked loop (PLL) including a PLL input and a PLL output; and (b) a multiplexer, wherein the multiplexer includes a multiplexer output electrically coupled to the PLL input, wherein the multiplexer further includes M multiplexer inputs, M being an integer greater than 1, wherein the multiplexer is configured to electrically couple one multiplexer input of the M multiplexer inputs to the multiplexer output, and wherein the multiplexer cannot simultaneously electrically couple more than one multiplexer input of the M multiplexer inputs to the multiplexer output.

The present invention provides a structure (and a method for operating the same) in which the fractional-N PLL can operate in any operating frequency region covering several pitch frequencies while keeping spurs low.

DETAILED DESCRIPTION OF THE INVENTION

Figure 1:
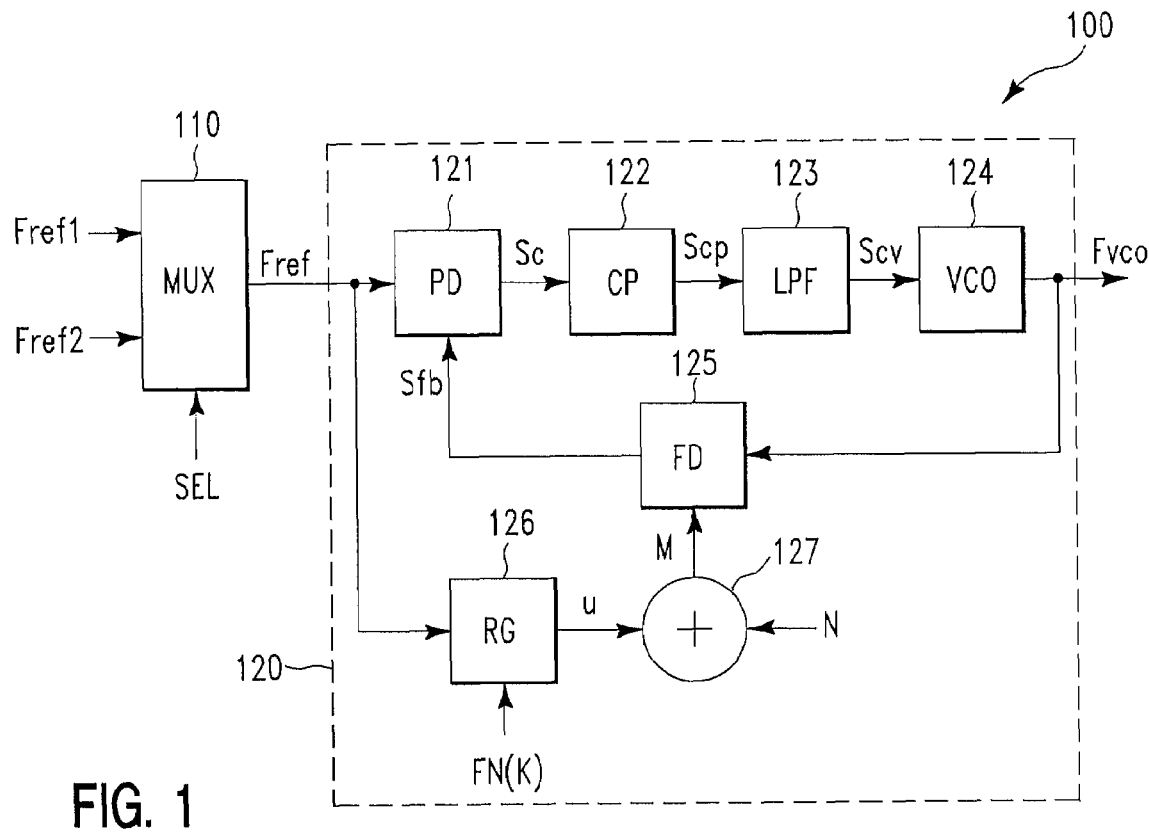
FIG. 1 shows a block diagram of a fractional-N PLL, in accordance with embodiments of the present invention.

FIG. 1 shows a block diagram of a system 100, in accordance with embodiments of the present invention. More specifically, the system 100 comprises a fractional-N phase-locked loop (PLL) 120 and a multiplexer (MUX) 110 electrically coupled to the fractional-N PLL 120. The fractional-N PLL 120 receives a reference signal Fref having a frequency Fref from the MUX 110. The MUX 110 receives as inputs two reference signals Fref1 and Fref2 having frequencies Fref1 and Fref2, respectively. Hereafter, the same name is used for both a signal and its frequency for simplicity. For example, the same name Fref1 is used for both the reference signal Fref1 and the reference frequency Fref1 and the same name Fref2 is used for both the reference signal Fref2 and the reference frequency Fref2.

The fractional-N PLL 120 comprises a phase detector (PD) 121, a charge pump (CP) 122, a loop filter (LPF) 123, and a voltage control oscillator (VCO) 124 electrically coupled together in series. The fractional-N PLL 120 further comprises (i) a frequency divider (FD) 125 electrically coupled to the phase detector 121 and the VCO 124, (ii) a random number generator (RG) 126, and (iii) a summing circuit 127 electrically coupled to the random number generator 126 and the frequency divider 125. The VCO 124 outputs a signal Fvco having a frequency Fvco. For simplicity, the same name Fvco is used for both the signal Fvco and the oscillating frequency Fvco.

In one embodiment, the operation of the fractional-N PLL 120 of FIG. 1 is as follows. The phase detector 121 (i) detects the difference in phase and frequency between the reference signal Fref and a feedback signal Sfb and (ii) generates a control signal Sc to the charge pump 122. The control signal Sc can be an up control signal or a down control signal based on whether the feedback signal Sfb is lagging or leading the input signal Fref. The up or down control signals determine whether the VCO 124 needs to operate at a higher or lower frequency Fvco, respectively.

More specifically, if the charge pump 122 receives an up control signal, current is driven into the loop filter 123 through a charge pump signal Scp. Conversely, if the charge pump 122 receives a down control signal, current is drawn from the loop filter 123 through the charge pump signal Scp.

The loop filter 123 converts the charge pump signal Scp to a control voltage signal Scv that is used to bias the VCO 124. Based on the control voltage signal Scv, the VCO 124 oscillates at a higher or lower frequency Fvco, which affects the phase and frequency of the feedback signal Sfb.

The frequency divider 125 performs frequency division upon the oscillating frequency Fvco and a frequency dividing ratio M to generate the feedback signal Sfb. The frequency dividing ratio M is created by adding a pseudo random number with the mean value of u and an integer N using the summing circuit 127, wherein $$u = \frac{\sum_{i=1}^{L} P(i)}{L},$$

wherein P(i) is the signed pseudo random number generated by the pseudo random number generator RG 126 and L is a large positive integer, and wherein $|u| \leq 0.5$. FN(K) is the K bit input bus to RG 126, when a signed binary number Q is applied to FN(K), u approaches to $Q*2^{-K}$ when L is large enough. The integer N can be generated from a counter (not shown). The above described system 100 operates according to the following formula:

$$Fvco = (N+u)*Fref \qquad (1)$$

It should be noted that the oscillating frequency Fvco contains spurious signals (also called spurs). The offset frequency of a spur is the difference of the operation frequency Fvco of VCO 124 and the nearest pitch frequency, and magnitude or the peak power density of a spur depends on the offset frequency. The spur is high at the small offset frequency and the spur is low at the large offset frequency. High spur magnitudes are undesirable. The frequency regions of the oscillating frequency Fvco in which the magnitudes of the spurs are high can be referred to as high spur frequency regions, whereas the frequency regions of the oscillating frequency Fvco in which the magnitudes of the spurs are low can be referred to as low spur frequency regions. A high spur region is centered by a pitch frequency, and the frequency region is usually +/−ten times of the PLL close loop bandwidth. A low spur region is located between two neighboring high spur regions.

Figure 2:
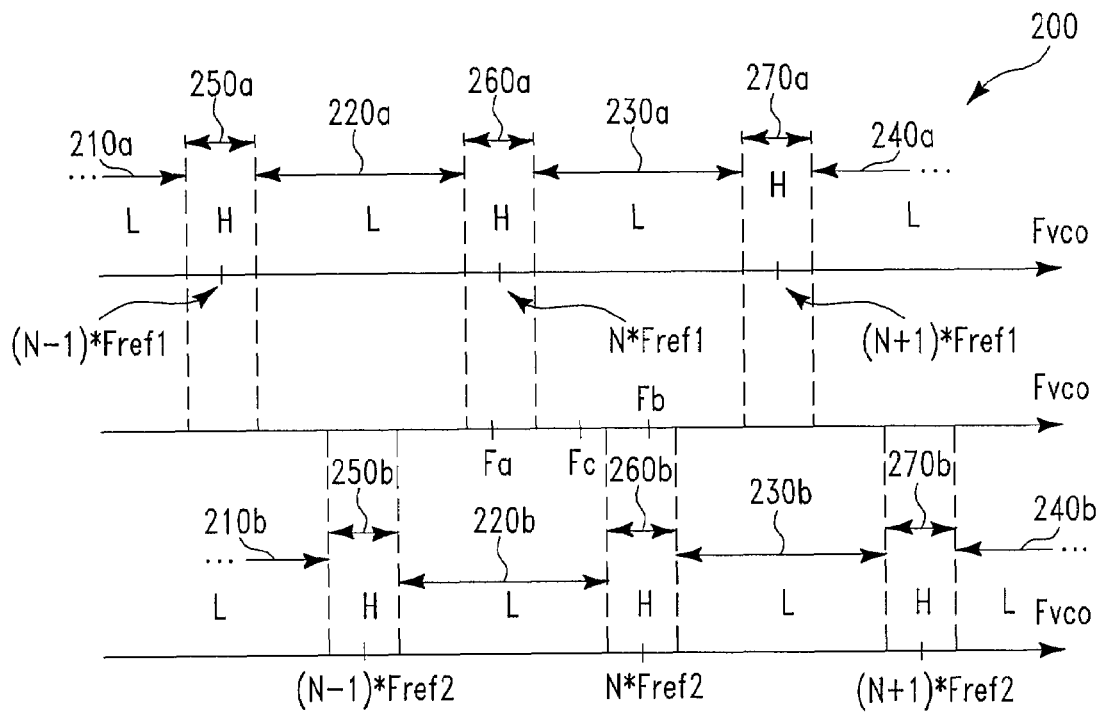
FIG. 2 shows high spur frequency regions and low spur frequency regions corresponding to two cases of two reference signals of the fractional-N PLL of FIG. 1, in accordance with embodiments of the present invention.

FIG. 2 shows high spur frequency regions and low spur frequency regions corresponding to two cases in which Fref=Fref1 and Fref=Fref2, in accordance with embodiments of the present invention. More specifically, the top portion of FIG. 2 shows the high spur frequency regions and low spur frequency regions in the case of Fref=Fref1 (i.e., the MUX 110 selects the reference signal Fref1 to be the reference signal Fref). When the oscillating frequency Fvco approaches any integer divide ratio frequency, also called pitch frequency, from the left and from the right, the magnitudes of the spurs increase. For instance, in the case of Fref=Fref1, when the oscillating frequency Fvco approaches pitch frequencies (N−1)*Fref1, N*Fref1, and (N+1)*Fref1, the magnitudes of the spurs increase.

In one embodiment, frequencies of the oscillating frequency Fvco which are within a pre-specified frequency distance from a pitch frequency can be considered within a high spur frequency region. In one embodiment, the pre-specified frequency distance is equal to 10 times PLL bandwidth. More specifically, in the case of Fref=Fref1 (corresponding to the top portion of FIG. 2), frequencies of the oscillating frequencies Fvco which are within 10 times PLL bandwidth from pitch frequencies (N−1)*Fref1, N*Fref1, and (N+1)*Fref1 can be considered being within high spur frequency regions 250a, 260a and 270a, respectively. The frequency regions of the signal Fvco outside high spur frequency regions are considered low spur frequency regions. For example, the frequency regions 210a, 220a, 230a, and 240a can be considered low spur frequency regions. In FIG. 2, the high spur frequency regions are marked "H", whereas the low spur frequency regions are marked "L".

The bottom portion of FIG. 2 shows high spur frequency regions and low spur frequency regions in the case of Fref=Fref2 (i.e., the MUX 110 selects the reference signal Fref2 to be the reference signal Fref). In the case of Fref=Fref2, when the oscillating frequency Fvco approaches the pitch frequencies (N−1)*Fref2, N*Fref2, and (N+1)*Fref2, the magnitudes of the spurs increase.

In one embodiment, in the case of Fref=Fref2 (corresponding to the bottom portion of FIG. 2), frequencies of the oscillating frequencies Fvco which are within 10 times PLL bandwidth from the pitch frequencies (N−1)*Fref2, N*Fref2, and (N+1)*Fref2 can be considered within high spur frequency regions 250b, 260b and 270b, respectively. The frequency regions of the signal Fvco outside high spur frequency regions are considered low spur frequency regions. For example, the frequency regions 210b, 220b, 230b, and 240b can be considered low spur frequency regions.

With reference to both FIGS. 1 and 2, depending on a select signal SEL, the MUX 110 allows one of two reference signals Fref1 and Fref2 to pass through itself as the reference frequency Fref (i.e., Fref=Fref1 or Fref=Fref2). It should be noted that the reference signals Fref1 and Fref2 can be generated from a Temperature Compensated Crystal Oscillator (TCXO) (not shown).

In one embodiment, the reference frequencies Fref1 and Fref2 and the pre-specified frequency distance are chosen such that for any pre-specified operating frequency of the VCO 124 of FIG. 1, the select signal SEL can be chosen such that the VCO 124 operates in a low spur frequency region. This can be achieved by choosing the reference frequencies Fref1 and Fref2 and the pre-specified frequency distance such that (i) the high spur frequency regions 250a, 260a, and 270a are completely within the low spur frequency regions 210b, 220b, and 230b, respectively, and (ii) the high spur frequency regions 250b, 260b, and 270b are completely within the low spur frequency regions 220a, 230a, and 240a, respectively, as shown in FIG. 2.

For instance, if the VCO 124 of FIG. 1 is to operate at frequency Fa (FIG. 2), then the select signal SEL can be chosen such that Fref=Fref2 resulting in the VCO 124 operating in the low spur frequency region 220b. If the VCO 124 is to operate at frequency Fb (FIG. 2), then the select signal SEL can be chosen such that Fref=Fref1 resulting in the VCO 124 operating in the low spur frequency region 230a. If the VCO 124 is to operate at frequency Fc (FIG. 2), then the select signal SEL can be chosen such that either (i) Fref=Fref1 resulting in the VCO 124 operating in the low spur frequency region 230a or (ii) Fref=Fref2 resulting in the VCO 124 operating in the low spur frequency region 220b. In this case, the preferred selection depends on which region where the frequency difference between Fc and the pitch reference is larger. The reference frequency selection switching point between Fref1 and Fre2 should be the middle point of the nearest pitch frequencies of Fref1 and Fref2 to minimize the spur magnitudes. More specifically, with reference to FIG. 2, if |Fc−N*Fref1|>|Fc−N*Fref2|, then the select signal SEL can be chosen such that Fref=Fref1. If |Fc−N*Fref1|≦|Fc−N*Fref2|, then the select signal SEL can be chosen such that Fref=Fref2.

In the embodiments described above, the high spur frequency regions 250a, 260a, 270a, 250b, 260b, and 270b are completely within the low spur frequency regions 210b, 220b, 230b, 220a, 230a, and 240a, respectively. In addition, in one embodiment, the reference frequencies Fref1 and Fref2 are also chosen such that N*Fref2 is at the mid point of the N*Fref1 and the (N+1)*Fref1. In other words, $$Fref2 = Fref1 + \Delta f \quad (2)$$

wherein $$\Delta f = 0.5 * Fref1/N \quad (3)$$

In summary, the reference frequencies Fref1 and Fref2 and the pre-specified frequency distance are chosen such that for any specified operating frequency of the VCO 124 of FIG. 1, the select signal SEL can be chosen such that the VCO 124 operates in a low spur frequency region. More specifically, in one embodiment, the specified operating frequency is compared with the low spur frequency regions of the two cases Fref=Fref1 and Fref=Fref2. If the specified operating frequency is within one of the low spur frequency regions of the case Fref=Fref1, then select signal SEL can be chosen such that Fref=Fref1. If the specified operating frequency is not within one of the low spur frequency regions of the case Fref=Fref1 but is within one of the low spur frequency regions of the case Fref=Fref2, then select signal SEL can be chosen such that Fref=Fref2. If the specified operating frequency is within one of the low spur frequency regions of the case Fref=Fref1 and is also within one of the low spur frequency regions of the case Fref=Fref2, then the selection decision depends on which region where the frequency difference between the frequency and the pitch reference is larger.

Figure 3:
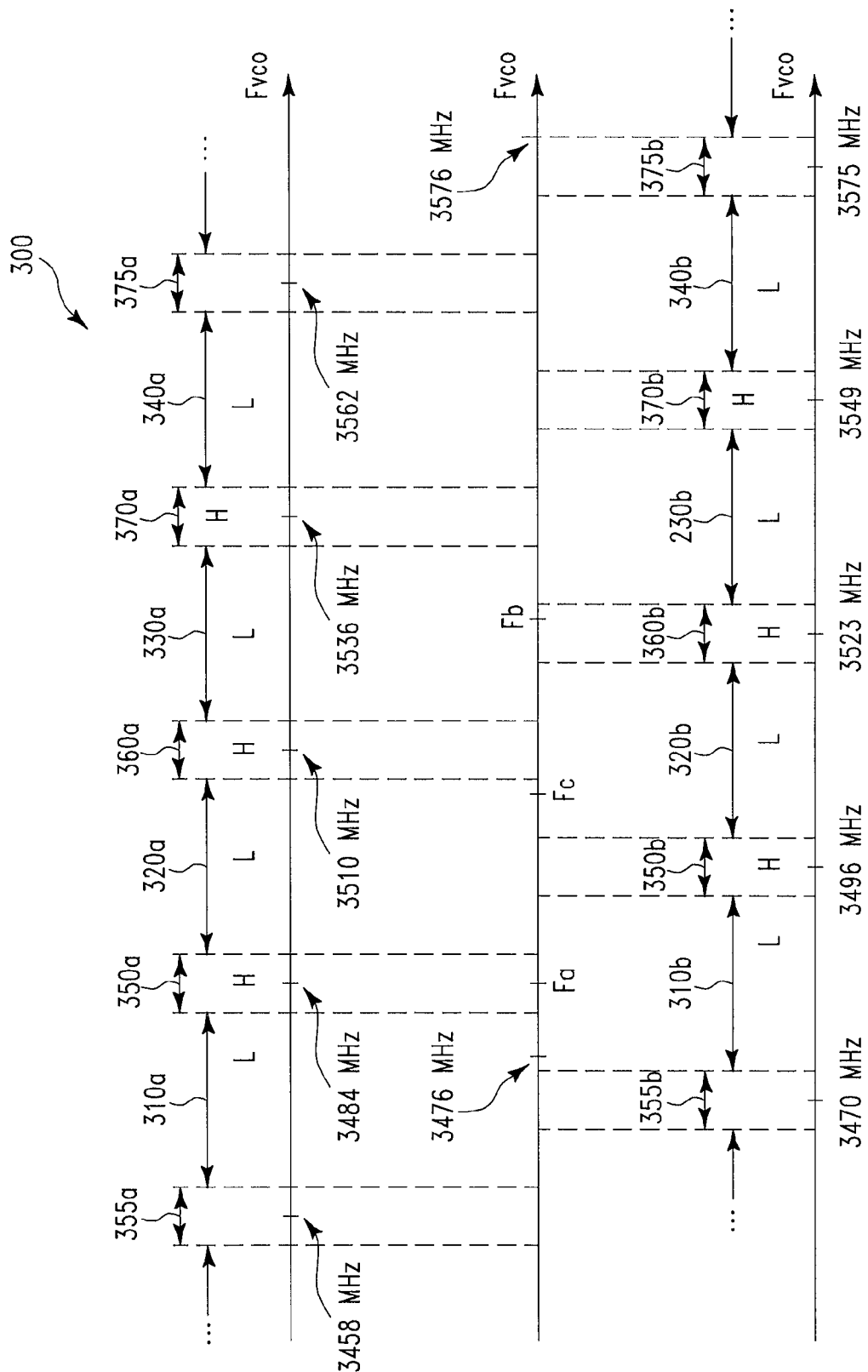
FIG. 3 shows high spur frequency regions and low spur frequency regions of an example illustrating the operation of the fractional-N PLL of FIG. 1, in accordance with embodiments of the present invention.

FIG. 3 shows high spur frequency regions and low spur frequency regions of an example illustrating the operation of the system 100 of FIG. 1, in accordance with embodiments of the present invention. Assume that the frequency region of the signal Fvco is 3476-3576 MHz. Assume further that Fref1=26 MHz. As a result, from the formula (1) above, N will vary from 133-137. Let N=135 for the middle value. Therefore, from the formula (3) above, Δf=0.5*Fref1/N=0.5*26/135=0.0963 MHz. As a result, from the formula (2), Fref2=Fref1+Δf=26.0963 MHz. Assume further that the PLL loop bandwidth=100 KHz. As a result, 10 times PLL loop bandwidth=1 MHz.

The top portion of FIG. 3 shows high spur frequency regions and low spur frequency regions in the case of Fref=Fref1=26 MHz. It should be noted that pitch frequencies (N−2)*Fref1, (N−1)*Fref1, N*Fref1, (N+1)*Fref1, and (N+2)*Fref1 are equal to 3458 MHz, 3484 MHz, 3510 MHz, 3536 MHz, and 3562 MHz, respectively. Because frequencies within 10 times PLL loop bandwidth (1 MHz) from a pitch frequency are considered being within a high spur frequency region, high spur frequency regions 355a, 350a, 360a, 370a, and 375a are 3457-3459 MHz, 3483-3485 MHz, 3509-3511 MHz, 3535-3537 MHz, and 3561-3563 MHz, respectively.

The bottom portion of FIG. 3 shows high spur frequency regions and low spur frequency regions in the case of Fref=Fref2=26.0963 MHz. It should be noted that pitch frequencies (N−2)*Fref2, (N−1)*Fref2, N*Fref2, (N+1)*Fref2, and (N+2)*Fref2 are equal to 3470 MHz, 3496 MHz, 3523 MHz, 3549 MHz, and 3575 MHz, respectively. Because frequencies within 10 times PLL loop bandwidth (1 MHz) from a pitch frequency are considered being within a high spur frequency region, high spur frequency regions 355b, 350b, 360b, 370b, and 375b are 3457-3459 MHz, 3483-3485 MHz, 3509-3511 MHz, 3535-3537 MHz, and 3561-3563 MHz, respectively.

If the VCO 124 of FIG. 1 is to operate at frequency Fa (FIG. 3), then the select signal SEL can be chosen such that Fref=Fref2 resulting in the VCO 124 operating in the low spur frequency region 310b. If the VCO 124 is to operate at frequency Fb (FIG. 3), then the select signal SEL can be chosen such that Fref=Fref1 resulting in the VCO 124 operating in the low spur frequency region 330b. If the VCO 124 is to operate at frequency Fc (FIG. 3), then the select signal SEL can be chosen such that either (i) Fref=Fref1 resulting in the VCO 124 operating in the low spur frequency region 320a or (ii) Fref=Fref2 resulting in the VCO 124 operating in the low spur frequency region 320b. Further, if |Fc−3,510 MHz|>|Fc−3,496 MHz|, then the select signal SEL can be chosen such that Fref=Fref1 resulting in the VCO 124 operating in the low spur frequency region 320a. If |Fc−3,510 MHz|≦|Fc−3,496 MHz|, then the select signal SEL can be chosen such that Fref=Fref2 resulting in the VCO 124 operating in the low spur frequency region 320b.

In summary, in this example, for any specified operating frequency of the VCO 124 in the frequency region from 3476 MHz to 3576 MHz, the select signal SEL can be chosen such that Fref=Fref1 or Fref=Fref2 resulting in the VCO 124 always operating in a low spur frequency region.

In one embodiment, with reference to the formulas (1), (2), and (3) above, it is specified that N is a positive number which must be greater than the possible maximum number of P(i) to keep the instant divide ratio M not less than two.

Figure 4:
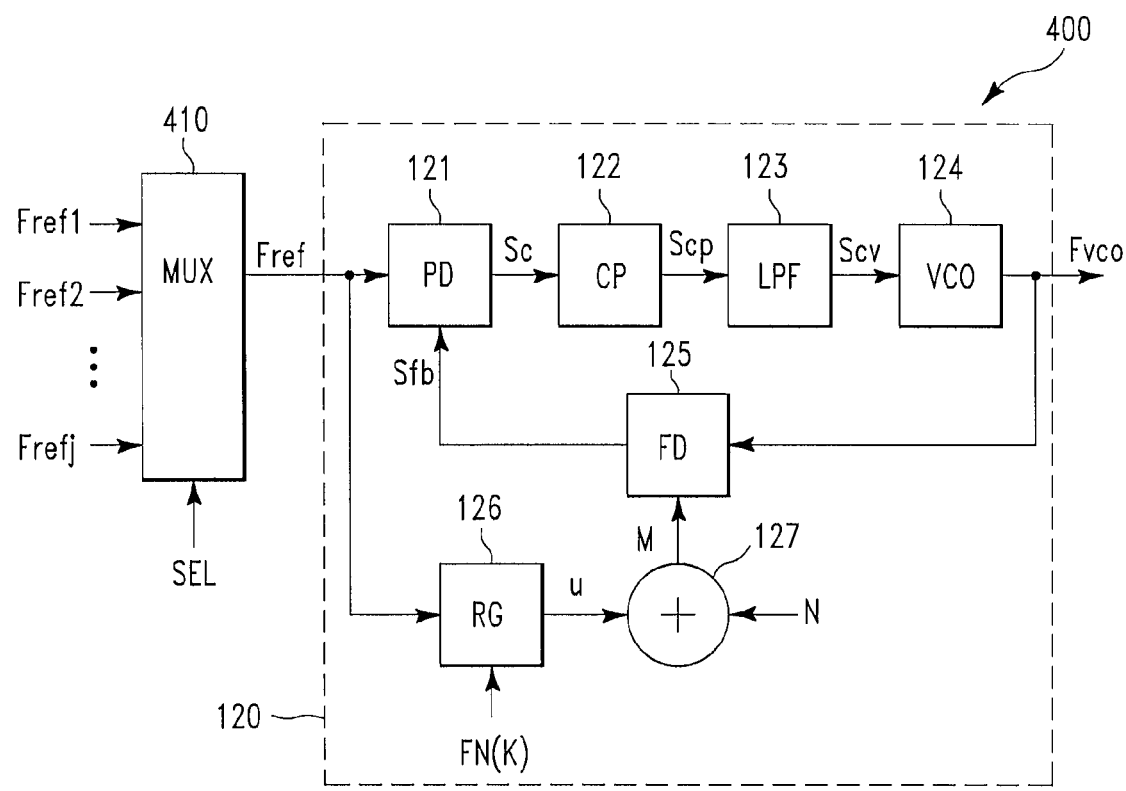
FIG. 4 shows a block diagram of another fractional-N PLL, in accordance with embodiments of the present invention.

FIG. 4 shows a block diagram of another system 400, in accordance with embodiments of the present invention. More specifically, the structure of the system 400 of FIG. 4 is similar to the structure of the system 100 of FIG. 1 except that the MUX 410 of the system 400 receives as inputs j reference signals Fref1-Frefj having frequencies Fref1-Frefj, respectively, wherein j is a positive integer greater than 2.

In one embodiment, the operation of the system 400 is similar to the operation of the system 100 of FIG. 1. More specifically, the reference frequencies Fref1-Frefj and the pre-specified frequency distance are chosen such that for any pre-specified operating frequency of the VCO 124 of FIG. 4, the select signal SEL can be chosen such that the VCO 124 operates in a low spur frequency region.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:
1. A system, comprising:
(a) a phase-locked loop (PLL) comprising:
 a phase detector including a phase detector input;
 a charge pump;
 a loop filter;
 a voltage controlled oscillator;
 a frequency divider;
 a summing circuit;
 a random number generator;
  wherein the voltage controlled oscillator is configured to output a VCO output signal having an operating frequency Fvco and resulting from a serially connected circuit path and a feedback circuit path,
  wherein the serially connected circuit path comprises the phase detector, the charge pump, the loop filter, and the voltage controlled oscillator electrically coupled together in series;
  wherein the feedback circuit path comprises the frequency divider through which the VCO output signal is fed back to the phase detector; and
(b) a multiplexer,
 wherein the multiplexer includes a multiplexer output electrically coupled to the phase detector input,
 wherein the multiplexer further includes M multiplexer inputs, M being an integer greater than 1,
 wherein each multiplexer input of the M multiplexer inputs is configured to receive a multiplexer input signal having a multiplexer input reference frequency,
 wherein the multiplexer is configured to electrically couple one multiplexer input of the M multiplexer inputs to the multiplexer output,
 wherein the multiplexer cannot simultaneously electrically couple more than one multiplexer input of the M multiplexer inputs to the multiplexer output,
 wherein the multiplexer is further configured to carry on the multiplexer output a multiplexer output signal having a reference frequency Fref,
 wherein the phase detector is configured to receive the multiplexer output signal via the phase detector input,
 wherein the random number generator is configured to receive the multiplexer output signal such that the multiplexer output is directly coupled to an input of the random number generator, wherein the random number generator is further configured to output a signal u responsive to the multiplexer output signal and a K-bit input signal, wherein the summing circuit is configured to receive the signal u from the random number generator and to sum the signal u with a signal N generated from a counter, wherein the frequency divider is configured to receive an output of the summing circuit, wherein Fvco and Fref are such that Fvco=(N+u)*Fref, wherein N is an integer, wherein $$u = \frac{\sum_{i=1}^{L} P(i)}{L}$$

wherein P(i) is a signed pseudo random number sequence generated by the random number generator, wherein L is a large positive integer, and wherein $|u| \leq 0.5$.

2. The system of claim 1, wherein M is equal to 2.

3. The system of claim 1, wherein M>2.

* * * * *